United States Patent
Chang et al.

(10) Patent No.: US 11,322,398 B2
(45) Date of Patent: May 3, 2022

(54) PROCESS FOR MAKING INTERCONNECT OF GROUP III-V SEMICONDUCTOR DEVICE, AND GROUP III-V SEMICONDUCTOR DEVICE INCLUDING INTERCONNECT MADE THEREBY

(71) Applicant: NATIONAL CHIAO TUNG UNIVERSITY, Hsinchu (TW)

(72) Inventors: Edward-Yi Chang, Baoshan Township (TW); Yueh-Chin Lin, Hsinchu (TW); Ming-Yen Tsai, Changhua (TW); Po-Sheng Chang, Kaohsiung (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 327 days.

(21) Appl. No.: 16/702,282

(22) Filed: Dec. 3, 2019

(65) Prior Publication Data
US 2021/0074582 A1    Mar. 11, 2021

(30) Foreign Application Priority Data
Sep. 10, 2019   (TW) .................................. 108132587

(51) Int. Cl.
*H01L 21/768*   (2006.01)
*H01L 21/027*   (2006.01)
(Continued)

(52) U.S. Cl.
CPC .... *H01L 21/76846* (2013.01); *H01L 21/0274* (2013.01); *H01L 21/28575* (2013.01);
(Continued)

(58) Field of Classification Search
CPC .......... H01L 21/76846; H01L 21/0274; H01L 21/28575; H01L 21/76877;
(Continued)

(56) References Cited

U.S. PATENT DOCUMENTS 4,533,624 A * 8/1985 Sheppard ................ G03F 7/095
                                                          430/394
4,564,584 A * 1/1986 Fredericks ........ H01L 21/31654
                                                          430/323
(Continued)

OTHER PUBLICATIONS

Lee, Cheng-Shih et al.,"Copper-Airbridged Low-Noise GaAs PHEMT With Ti/WNx/Ti Diffusion Barrier for High-Frequency Applications", IEEE Transactions on Electron Devices, vol. 53, No. 8, Aug. 2006, pp. 1753-1758.

*Primary Examiner* — Caleen O Sullivan
(74) *Attorney, Agent, or Firm* — Lewis Roca Rothgerber Christie LLP

(57) ABSTRACT

A process for making an interconnect of a group III-V semiconductor device includes the steps of applying a positive photoresist layer and an image-reversible photoresist layer, subjecting the image-reversible photoresist and positive photoresist layers to patternwise exposure, subjecting the image-reversible photoresist layer to image reversal bake, subjecting the image-reversible photoresist and positive photoresist layers to flood exposure, subjecting the image-reversible photoresist and positive photoresist layers to development, depositing a diffusion barrier layer, depositing a copper layer, and removing the image-reversible photoresist and positive photoresist layers.

15 Claims, 6 Drawing Sheets

(51) Int. Cl.
*H01L 21/285* (2006.01)
*H01L 23/532* (2006.01)
*G03F 7/32* (2006.01)
*G03F 7/16* (2006.01)
*G03F 7/20* (2006.01)
*G03F 7/38* (2006.01)

(52) U.S. Cl.
CPC .. *H01L 21/76877* (2013.01); *H01L 23/53238* (2013.01); *G03F 7/16* (2013.01); *G03F 7/20* (2013.01); *G03F 7/32* (2013.01); *G03F 7/38* (2013.01)

(58) Field of Classification Search
CPC ........... H01L 23/53238; H01L 21/0272; H01L 21/76841; H01L 21/76885; H01L 23/53228; H01L 21/76804; H01L 33/0062; H01L 33/0093; H01L 33/44; H01L 33/62; G03F 7/16; G03F 7/20; G03F 7/32; G03F 7/38; G03F 7/095; G03F 7/2022
USPC ......... 257/751; 430/311, 330, 321, 326, 394
See application file for complete search history.

(56) References Cited

U.S. PATENT DOCUMENTS

| | | | | |
|---|---|---|---|---|
| 4,775,609 | A * | 10/1988 | McFarland | G03F 7/039 430/394 |
| 5,360,698 | A * | 11/1994 | Hanrahan | G03F 7/095 430/326 |
| 2006/0204903 | A1* | 9/2006 | Choi | H01L 51/56 430/328 |
| 2007/0040274 | A1 | 2/2007 | Lee et al. | |
| 2012/0261828 | A1* | 10/2012 | Bruce | H01L 21/76832 257/774 |
| 2013/0129991 | A1* | 5/2013 | Ndoye | H01L 21/0272 430/326 |
| 2019/0079400 | A1* | 3/2019 | Aihara | G03F 7/0035 |
| 2021/0398803 | A1* | 12/2021 | Ueno | H01L 21/0272 |

* cited by examiner

PROCESS FOR MAKING INTERCONNECT OF GROUP III-V SEMICONDUCTOR DEVICE, AND GROUP III-V SEMICONDUCTOR DEVICE INCLUDING INTERCONNECT MADE THEREBY

CROSS-REFERENCE TO RELATED APPLICATION

This application claims priority of Taiwanese Patent Application No. 108132587, filed on Sep. 10, 2019.

FIELD

The disclosure relates to a process for making an interconnect, and more particularly to a process for making an interconnect of a group III-V semiconductor device. The disclosure also relates to a group III-V semiconductor device including an interconnect made by the process.

BACKGROUND

Heterojunction bipolar transistors (HBTs) and high electron mobility transistors (HEMTs) are a few examples of power devices made from group III-V material (e.g., GaN, GaAs, etc.) that confers several advantages including high power, superior linearity, high cut-off frequency, low power loss, etc. to the power devices. Therefore, the group III-V material is considered as an excellent material for producing high-frequency power devices.

Since the high-frequency power devices are usually operated under conditions of high voltage, high current, and high frequency, it is required to provide the high-frequency power devices with current carrying capacity and heat dissipation capacity which are higher than those for general power devices. However, metal interconnects having a thickness of 2 μm, which are commonly used for the general power devices, are unable to withstand the aforesaid conditions used for operating the high-frequency power devices. In addition, when the operating frequency for the high-frequency power devices provided with the metal interconnects having insufficient height are raised, the parasitic impedance of the high-frequency power devices will be increased significantly, which may negatively affect the operating performance of the high-frequency powder devices. Therefore, in order to meet the operating performance of the high-frequency power devices, it is desirable to provide a metal interconnect having a sufficient height.

U.S. Patent Publication No. 2007/0040274 A1 discloses a fabrication method for making an interconnect of a group III-V semiconductor device to increase a process window of the interconnect. The fabrication method includes the steps of: forming an intermediate layer on a group III-V semiconductor device, defining a plurality of openings that expose a part of the group III-V semiconductor device in the intermediate layer, forming a first adhesion layer on the exposed part of the group III-V semiconductor device, forming a diffusion barrier layer on the first adhesion layer, forming a second adhesion layer on the diffusion barrier layer, and forming a copper layer on the second adhesion layer. In the fabrication method, a stacked-layer structure that includes the second adhesion layer/the diffusion barrier layer/the first adhesion layer is formed at the interface between the group III-V semiconductor device and the copper wire line, so as to ensure that the diffusion barrier layer adheres to the group III-V semiconductor device, the intermediate layer, and the copper layer effectively, thus preventing the copper of the copper wire line from diffusing into the group III-V semiconductor device.

SUMMARY

A first object of the disclosure is to provide a process for making an interconnect of a group III-V semiconductor device, in which the interconnect thus made has a significantly increased height.

A second object of the disclosure is to provide a group III-V semiconductor device including the interconnect made by the process.

According to a first aspect of the disclosure, there is provided a process for making an interconnect of a group III-V semiconductor device, which includes the steps of:

a) applying a positive photoresist layer having a first thickness on a conductive part of the group III-V semiconductor device;

b) applying an image-reversible photoresist layer having a second thickness on the positive photoresist layer;

c) subjecting the image-reversible photoresist layer and the positive photoresist layer to patternwise exposure so as to permit each of the image-reversible photoresist layer and the positive photoresist layer to be formed into a first portion which is in a developable form and a second portion which is in a non-developable form, the first portion and the second portion of the image-reversible photoresist layer overlying the first portion and the second portion of the positive photoresist layer, respectively;

d) subjecting the image-reversible photoresist layer to image reversal bake so as to convert the first portion and the second portion of the image-reversible photoresist layer from the developable form and the non-developable form into the non-developable form and the developable form, respectively;

e) subjecting the image-reversible photoresist layer and the positive photoresist layer to flood exposure so as to convert the second portion of the positive photoresist layer from the non-developable form into the developable form;

f) subjecting the image-reversible photoresist layer and the positive photoresist layer to development to remove the second portion in the developable form of each of the image-reversible photoresist layer and the positive photoresist layer so as to permit the image-reversible photoresist layer to be formed with undercut sidewalls bordering an opening that extends downwardly to terminate at the conductive part of the group III-V semiconductor device;

g) depositing a diffusion barrier layer on the conductive part of the group III-V semiconductor device through the opening; and h) depositing a copper layer on the diffusion barrier layer through the opening to form the interconnect.

According to a second aspect of the disclosure, there is provided a group III-V semiconductor device, which includes a substrate, a conductive part formed on the substrate, and an interconnect formed on the conductive part and made by the process of the first aspect of the disclosure.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Figure 1:
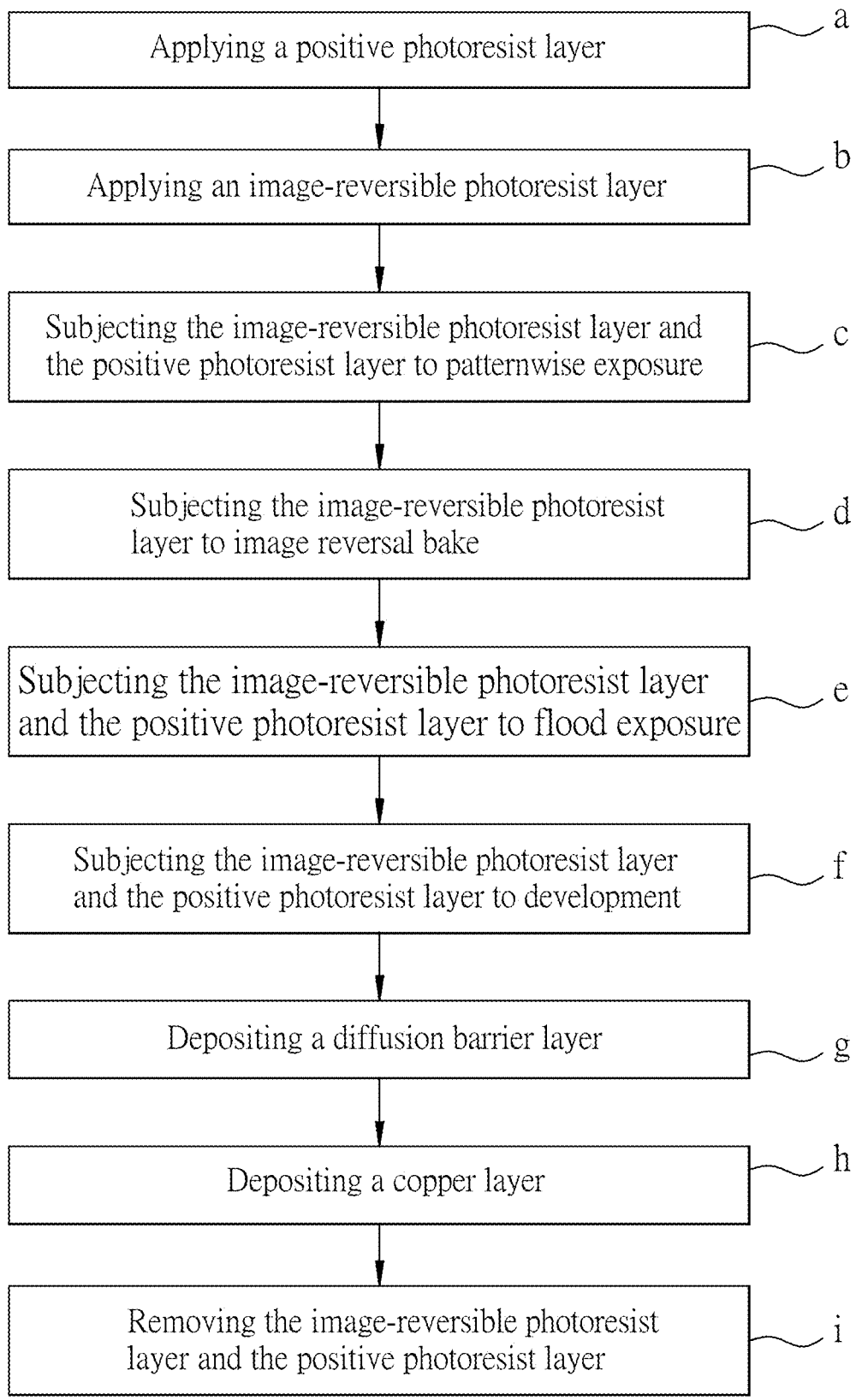
FIG. 1 is a flow diagram of an embodiment of a process for making an interconnect of a group III-V semiconductor device according to the disclosure.

Referring to FIGS. 1 to 8, an embodiment of a process for making an interconnect 25 of a group III-V semiconductor device 2 according to the disclosure includes the steps of: a) applying a positive photoresist layer 200, b) applying an image-reversible photoresist layer 300, c) subjecting the image-reversible photoresist layer 300 and the positive photoresist layer 200 to patternwise exposure, d) subjecting the image-reversible photoresist layer 300 to image reversal bake, e) subjecting the image-reversible photoresist layer 300 and the positive photoresist layer 200 to flood exposure, f) subjecting the image-reversible photoresist layer 300 and the positive photoresist layer 200 to development, g) depositing a diffusion barrier layer 24, h) depositing a copper layer, and i) removing the image-reversible photoresist layer 300 and the positive photoresist layer 200.

Figure 2:
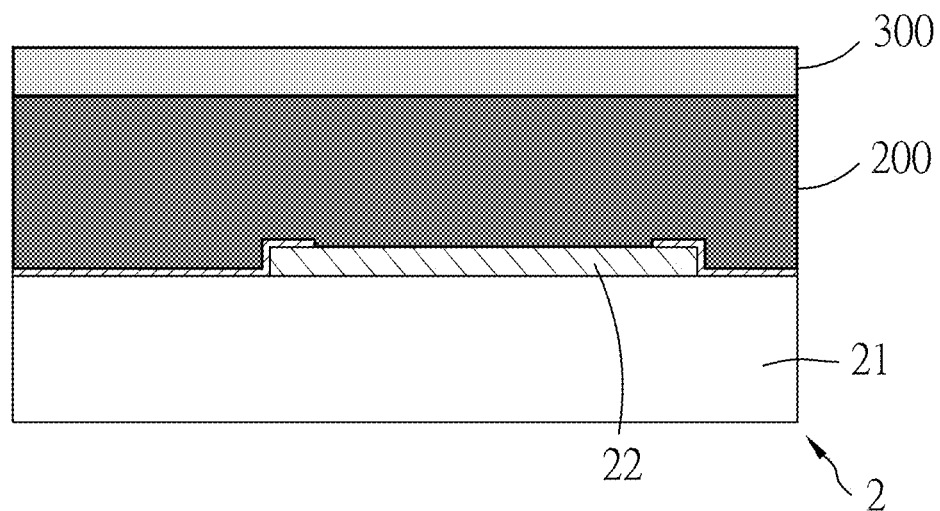
FIGS. 2 to 8 are schematic views illustrating consecutive steps of the embodiment of the process according to the disclosure.

Specifically referring to FIG. 2, in step a), the positive photoresist layer 200 having a first thickness is applied on a conductive part 22 of the group III-V semiconductor device 2.

The conductive part 22 is disposed on a group III-V semiconductor component 21 of the group III-V semiconductor device 2 so as to be formed as an electrode. The group III-V semiconductor component 21 can be any semiconductor power component well known in the art, such as a heterojunction bipolar transistor (HBT), a high electron mobility transistor (HEMT), or a metal oxide semiconductor field effect transistor (MOSFET), which is made of, for example, gallium arsenide (GaAs).

In certain embodiments, step a) is implemented by spin coating a positive photoresist on the conductive part 22 of the group III-V semiconductor device 2 at a spin speed ranging from 500 rpm to 4500 rpm for a time period ranging from 5 seconds to 60 seconds, so as to form the positive photoresist layer 200 after the positive photoresist is dried. The positive photoresist can be any positive photoresist well known in the art, which is dissolvable with a developer after irradiation with light (for example, ultraviolet light). A non-limiting example of the positive photoresist is AZ4620 (commercially available from Merck).

In step b), the image-reversible photoresist layer 300 having a second thickness is applied on the positive photoresist layer 200. In certain embodiments, the second thickness of the image-reversible photoresist layer 300 is smaller than the first thickness of the positive photoresist layer 200. In certain embodiments, the first thickness is in a range from 2 µm to 12 µm, and the second thickness is in a range from 1.14 µm to 2.3 µm.

In certain embodiments, step b) is implemented by spin coating an image-reversible photoresist on the positive photoresist layer 200 at a spin speed ranging from 500 rpm to 6000 rpm for a time period ranging from 5 seconds to 60 seconds, so as to form image-reversible photoresist layer 300 after the image-reversible photoresist is dried. A non-limiting example of the image-reversible photoresist is AZ5214E (commercially available from Merck).

Figure 3:
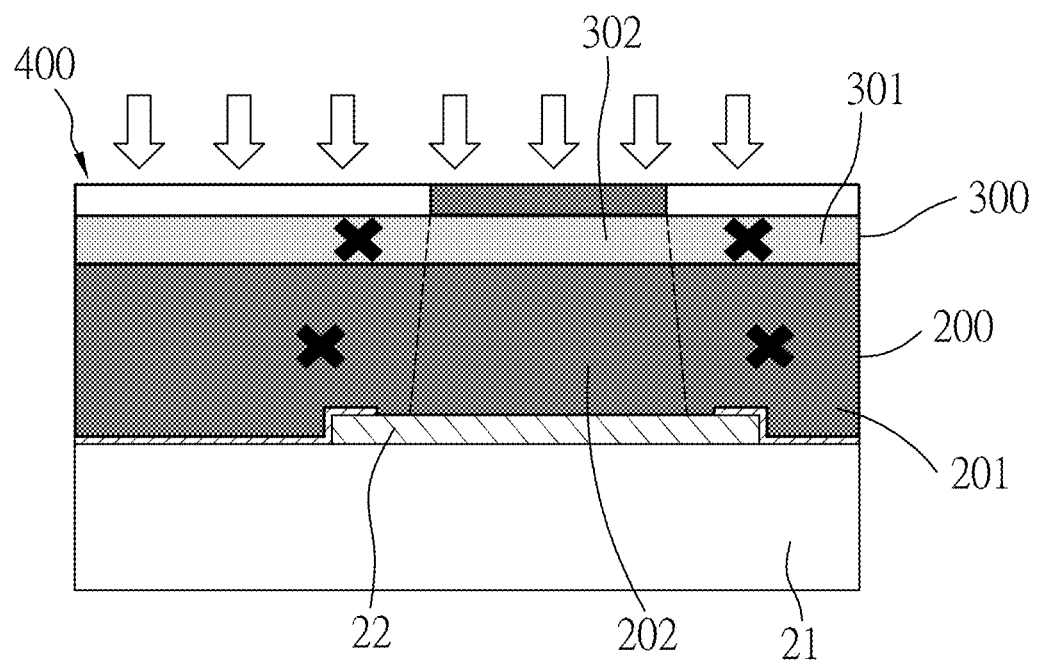

Specifically referring to FIG. 3, in step c), the image-reversible photoresist layer 300 and the positive photoresist layer 200 are subjected to the patternwise exposure so as to permit each of the image-reversible photoresist layer 300 and the positive photoresist layer 200 to be formed into a first portion 301, 201 which is in a developable form (indicated with mark "X") and a second portion 302, 202 which is in a non-developable form. The first portion 301 and the second portion 302 of the image-reversible photoresist layer 300 overlie the first portion 201 and the second portion 202 of the positive photoresist layer 200, respectively.

In certain embodiments, in step c), the patternwise exposure is implemented by subjecting the image-reversible photoresist layer 300 and the positive photoresist layer 200 to exposure to a radiation having a wavelength ranging from 365 nm to 436 nm for a time period ranging from 0.3 second to 2 seconds through a mask 400. In certain embodiments, the patternwise exposure is implemented by exposure to ultraviolet light having a wavelength of 365 nm for a time period of 1.2 seconds.

Figure 4:
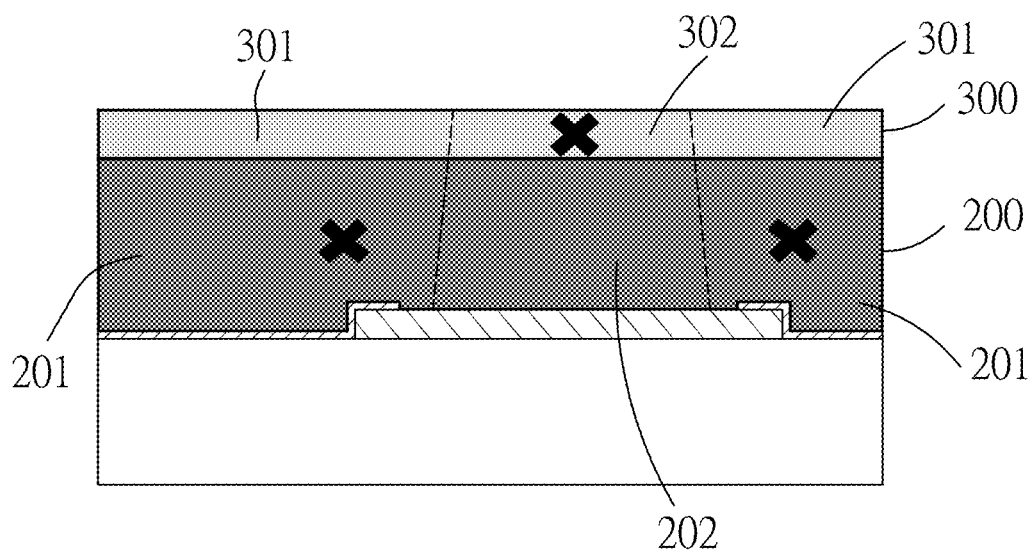

Specifically referring to FIG. 4, in step d), the image-reversible photoresist layer 300 is subjected to the image reversal bake so as to convert the first portion 301 and the second portion 302 of the image-reversible photoresist layer 300 from the developable form and the non-developable form into the non-developable form and the developable form, respectively. The portions in the developable form of the image-reversible photoresist layer 300 and the positive photoresist layer 200 after the image reversal bake are indicated with mark "X" in FIG. 4.

In certain embodiments, in step d), the image reversal bake is implemented at a baking temperature ranging from 100° C. to 120° C. for a time period ranging from 90 seconds to 150 seconds. In certain embodiments, the image reversal bake is implemented at a baking temperature of 110° C. for a time period of 120 seconds.

Figure 5:
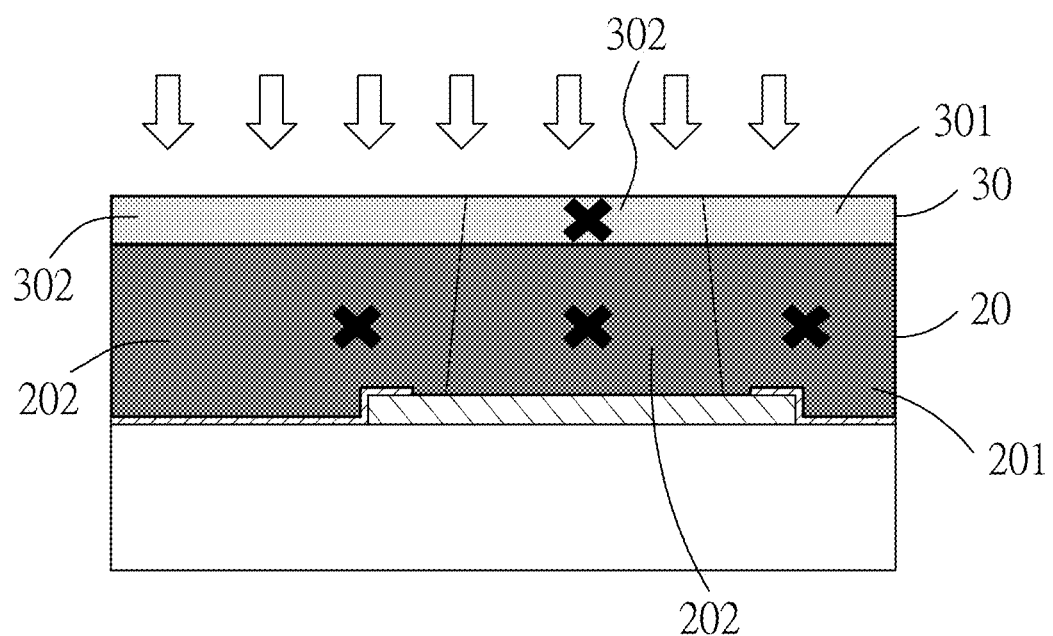

Specifically referring to FIG. 5, in step e), the image-reversible photoresist layer 300 and the positive photoresist layer 200 are subjected to the flood exposure so as to convert the second portion 202 of the positive photoresist layer 200 from the non-developable form into the developable form. The portions in the developable form of the image-reversible photoresist layer 300 and the positive photoresist layer 200 after the flood exposure are indicated with mark "X" in FIG. 5.

In certain embodiments, the flood exposure is implemented by subjecting the image-reversible photoresist layer 300 and the positive photoresist layer 200 to exposure to a radiation having a wavelength ranging from 365 nm to 436 nm for a time period ranging from 5 seconds to 15 seconds.

Figure 6:
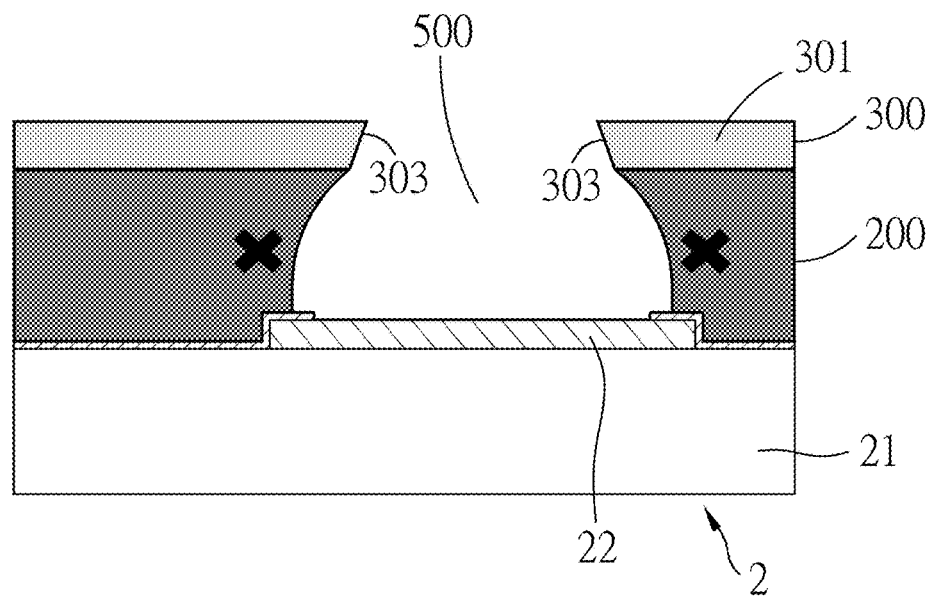

Specifically referring to FIG. 6, in step f), the image-reversible photoresist layer 300 and the positive photoresist layer 200 are subjected to development so as to remove the second portion 302, 202 in the developable form of each of the image-reversible photoresist layer 300 and the positive photoresist layer 200, thereby permitting the image-reversible photoresist layer 300 to be formed with undercut sidewalls 303 bordering an opening 500 that extends downwardly to terminate at the conductive part 22 of the group III-V semiconductor device 1. Specifically, the opening 500 extends downwardly in a diverging manner to terminate at the conductive part 22 of the group III-V semiconductor device 1.

In certain embodiments, in step f), the development is implemented in a developer under stirring for a time period ranging from 1.5 minutes to 5 minutes.

Figure 7:
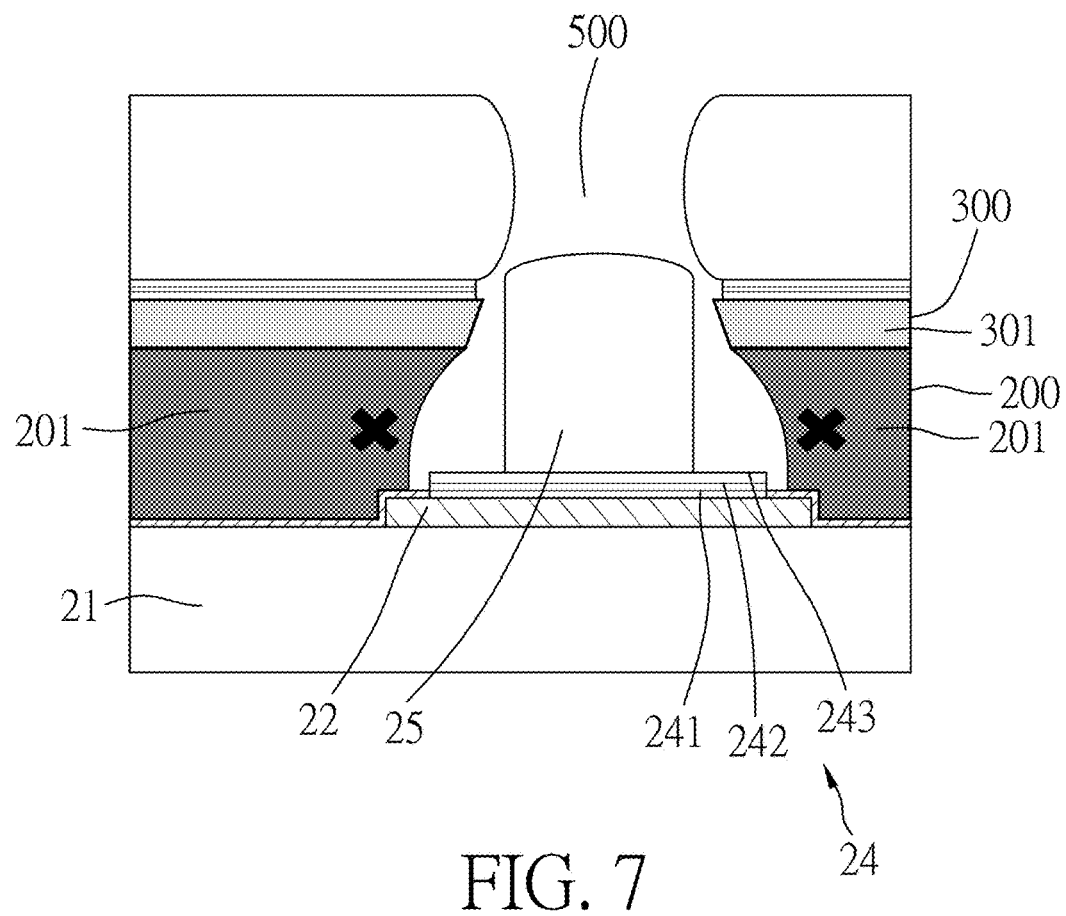

Specifically referring to FIG. 7, in step g), the diffusion barrier layer 24 is deposited on the conductive part 22 of the group III-V semiconductor device 2 through the opening

500 to prevent diffusion of copper atoms contained in the copper layer which is to be subsequently deposited. Without the diffusion barrier layer 24, diffusion of the copper atoms may degrade electrical performance of the group III-V semiconductor device 2. The diffusion barrier layer 24 may be formed as a single-layer configuration or a multi-layer configuration. In step g), as shown in the illustrated embodiment, the diffusion barrier layer 24 is formed as a multi-layer configuration, which includes the sub-steps of:

g1) sputter depositing a first titanium layer 241 having a thickness ranging from 10 nm to 50 nm on the conductive part 22 of the group III-V semiconductor device 2;

g2) sputter depositing a tungsten nitride layer 242 having a thickness ranging from 30 nm to 60 nm on the first titanium layer 241; and g3) sputter depositing a second titanium layer 243 having a thickness ranging from 10 nm to 50 nm on the tungsten nitride layer 242.

In step h), the copper layer is deposited on the diffusion barrier layer 24 through the opening 500 to form the interconnect 25. Since the image-reversible photoresist layer 300 is to be formed with undercut sidewalls 303 and the opening 500 that extends downwardly in a diverging manner, the copper layer deposited during step h) will not be in contact with the image-reversible photoresist layer 300, so that the interconnect 25 thus formed will be spaced part from the undercut sidewalls 303 and thus, the configuration of the interconnect 25 will not be impaired.

In certain embodiments, step h) (i.e., depositing the copper layer to form the interconnect 25) is implemented using an e-gun evaporation system.

Figure 8:
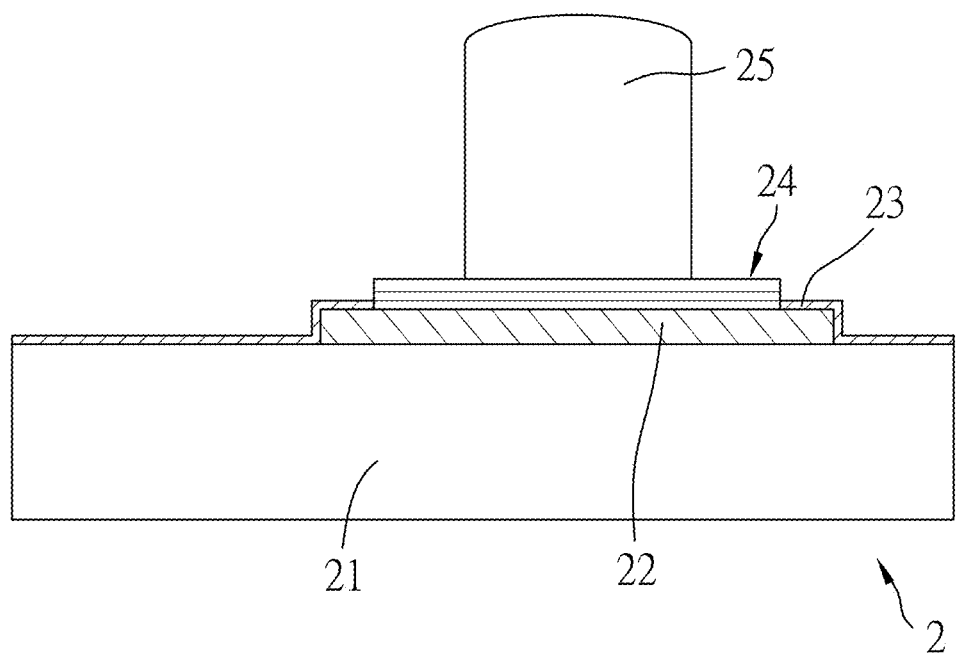

Referring to FIG. 8, the image-reversible photoresist layer 300 and the positive photoresist layer 200 are removed by, for example, a lift-off procedure.

Figure 9:
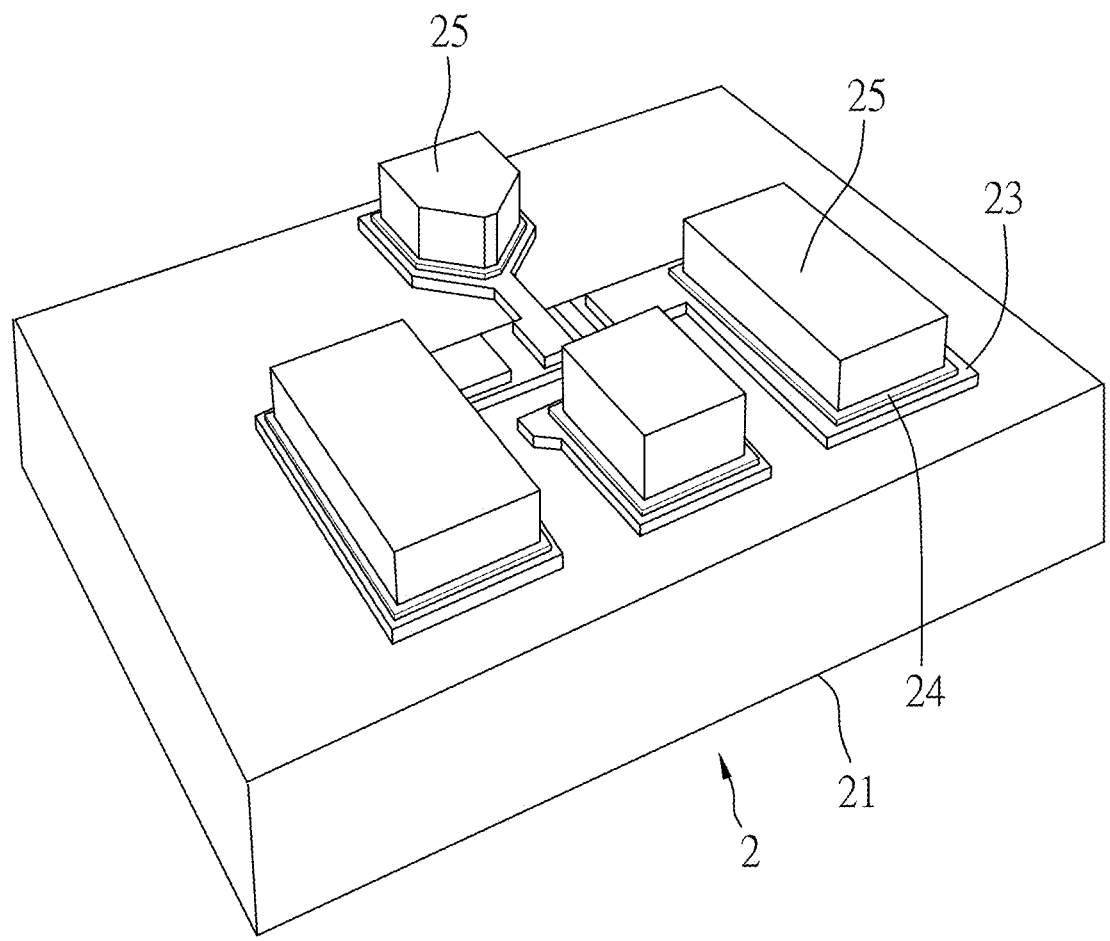
FIG. 9 is a schematic perspective view of a group III-V semiconductor device including an interconnect made by the embodiment of the process according to the disclosure.

Referring to FIGS. 8 and 9, the group III-V semiconductor device 2 included a substrate (e.g., the semiconductor component 21 described above); the conductive part 22 formed on the substrate; a dielectric isolation layer 23 partially covering the conductive part 22 so as to expose the conductive part 22 via an opening formed in the dielectric isolation layer 23; the interconnect 25 formed on the conductive part 22 which is made by the process described above; and the diffusion barrier layer 24 disposed between the conductive part 22 and the interconnect 25.

Particularly referring to FIGS. 1 and 7 again, in step a), the positive photoresist layer 200 having a relatively large thickness is applied on the conductive part 22 of the group III-V semiconductor device 2. Therefore, the interconnect 25 thus formed on the conductive part 22 of the group III-V semiconductor device 2 has a significantly increased height to provide enhanced electric conductivity and heat dissipation, so that the group III-V semiconductor device 2 formed with the interconnect 25 can be used for the high-frequency powder devices. In certain embodiments, the interconnect 25 has a thickness of larger than 3 μm and up to 10 μm.

In addition, since the image-reversible photoresist layer 300 is to be formed with the undercut sidewalls 303 and the opening 500 that extends downwardly in a diverging manner, the copper layer deposited during step h) will not be in contact with the image-reversible photoresist layer 300, so that the interconnect 25 thus formed will be spaced part from the undercut sidewalls 303 and thus, the configuration of the interconnect 25 will not be impaired.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A process for making an interconnect of a group III-V semiconductor device, comprising the steps of:
   a) applying a positive photoresist layer having a first thickness on a conductive part of the group III-V semiconductor device;
   b) applying an image-reversible photoresist layer having a second thickness on the positive photoresist layer;
   c) subjecting the image-reversible photoresist layer and the positive photoresist layer to patternwise exposure so as to permit each of the image-reversible photoresist layer and the positive photoresist layer to be formed into a first portion which is in a developable form and a second portion which is in a non-developable form, the first portion and the second portion of the image-reversible photoresist layer overlying the first portion and the second portion of the positive photoresist layer, respectively;
   d) subjecting the image-reversible photoresist layer to image reversal bake so as to convert the first portion and the second portion of the image-reversible photoresist layer from the developable form and the non-developable form into the non-developable form and the developable form, respectively;
   e) subjecting the image-reversible photoresist layer and the positive photoresist layer to flood exposure so as to convert the second portion of the positive photoresist layer from the non-developable form into the developable form;
   f) subjecting the image-reversible photoresist layer and the positive photoresist layer to development to remove the second portion in the developable form of each of the image-reversible photoresist layer and the positive photoresist layer so as to permit the image-reversible photoresist layer to be formed with undercut sidewalls bordering an opening that extends downwardly to terminate at the conductive part of the group III-V semiconductor device;
   g) depositing a diffusion barrier layer on the conductive part of the group III-V semiconductor device through the opening; and
   h) depositing a copper layer on the diffusion barrier layer through the opening to form the interconnect.

2. The process according to claim 1, further comprising, after step h), removing the image-reversible photoresist layer and the positive photoresist layer.

3. The process according to claim 1, wherein step a) is implemented by spin coating a positive photoresist on the conductive part of the group III-V semiconductor device at a spin speed ranging from 500 rpm to 4500 rpm for a time period ranging from 5 seconds to 60 seconds.

4. The process according to claim 1, wherein step b) is implemented by spin coating an image-reversible photoresist on the positive photoresist layer at a spin speed ranging from 500 rpm to 6000 rpm for a time period ranging from 5 seconds to 60 seconds.

5. The process according to claim 1, wherein the second thickness is smaller than the first thickness.

6. The process according to claim 5, wherein the first thickness is in a range from 2 μm to 12 μm, and the second thickness is in a range from 1.14 μm to 2.3 μm.

7. The process according to claim 1, wherein in step c), the patternwise exposure is implemented by subjecting the image-reversible photoresist layer and the positive photoresist layer to exposure to a radiation having a wavelength ranging from 365 nm to 436 nm for a time period ranging from 0.3 second to 2 seconds through a mask (400).

8. The process according to claim 1, wherein in step d), the image reversal bake is implemented at a baking temperature ranging from 100° C. to 120° C. for a time period ranging from 90 seconds to 150 seconds.

9. The process according to claim 1, wherein in step e), the flood exposure is implemented by subjecting the image-reversible photoresist layer and the positive photoresist layer to exposure to a radiation having a wavelength ranging from 365 nm to 436 nm for a time period ranging from 5 seconds to 15 seconds.

10. The process according to claim 1, wherein in step f), the development is implemented in a developer under stirring for a time period ranging from 1.5 minutes to 5 minutes.

11. The process according to claim 1, wherein step g) includes the sub-steps of:
   g1) sputter depositing a first titanium layer having a thickness ranging from 10 nm to 50 nm on the conductive part of the group III-V semiconductor device;
   g2) sputter depositing a tungsten nitride layer having a thickness ranging from 30 nm to 60 nm on the first titanium layer; and
   g3) sputter depositing a second titanium layer having a thickness ranging from 10 nm to 50 nm on the tungsten nitride layer.

12. The process according to claim 1, wherein step h) is implemented using an e-gun evaporation system.

13. The process according to claim 2, wherein the image-reversible photoresist layer and the positive photoresist layer are removed by a lift-off procedure.

14. A group III-V semiconductor device, comprising:
   a substrate;
   a conductive part formed on said substrate; and
   an interconnect formed on said conductive part and made by the process according to claim 1.

15. The group III-V semiconductor device according to claim 14, wherein said interconnect has a thickness of larger than 3 μm and up to 10 μm.

* * * * *